(12) United States Patent
Deak et al.

(10) Patent No.: US 10,277,992 B2
(45) Date of Patent: Apr. 30, 2019

(54) TMR NEAR-FIELD MAGNETIC COMMUNICATION SYSTEM

(71) Applicant: MultiDimension Technology Co., Ltd., Zhangjiagang (CN)

(72) Inventors: James Geza Deak, Zhangjiagang (CN); Haiping Guo, Zhangjiagang (CN); Songsheng Xue, Zhangjiagang (CN)

(73) Assignee: MultiDimension Technology Co., Ltd., Zhangjiagang, Jiangsu (CN)

( * ) Notice: Subject to any disclaimer, the term of this patent is extended or adjusted under 35 U.S.C. 154(b) by 244 days.

(21) Appl. No.: 15/326,587

(22) PCT Filed: Jul. 7, 2015

(86) PCT No.: PCT/CN2015/083461
§ 371 (c)(1),
(2) Date: Jan. 16, 2017

(87) PCT Pub. No.: WO2016/008370
PCT Pub. Date: Jan. 21, 2016

(65) Prior Publication Data
US 2017/0215012 A1 Jul. 27, 2017

(30) Foreign Application Priority Data
Jul. 14, 2014 (CN) .......................... 2014 1 0334560

(51) Int. Cl.
*H04R 25/00* (2006.01)
*H04W 4/80* (2018.01)
*G01R 33/09* (2006.01)

(52) U.S. Cl.
CPC ......... *H04R 25/554* (2013.01); *G01R 33/098* (2013.01); *H04R 25/00* (2013.01); *H04R 25/305* (2013.01); *H04W 4/80* (2018.02)

(58) Field of Classification Search
CPC .. H04R 25/554; H04R 25/43; H04R 2225/49; H04R 2225/61
See application file for complete search history.

(56) References Cited

U.S. PATENT DOCUMENTS

| 8,655,000 B1 * | 2/2014 | Solum ................. H04R 25/554 381/315 |
| 2007/0063690 A1 * | 3/2007 | De Wilde ............. G01R 15/20 324/117 R |

(Continued)

FOREIGN PATENT DOCUMENTS

| CN | 102208530 A | 10/2011 |
| CN | 102298125 | 12/2011 |

(Continued)

OTHER PUBLICATIONS

"International Application No. PCT/CN2015/083461, International Search Report and Written Opinion dated Aug. 26, 2015", (dated Aug. 26, 2015), 11 pgs.

*Primary Examiner* — Matthew A Eason
(74) *Attorney, Agent, or Firm* — Schwegman Lundberg & Woessner, P.A.

(57) ABSTRACT

This invention discloses a TMR near-field magnetic communication system, which is used for detecting AC and DC magnetic fields generated by a near-field magnetic communication system, and inputting AC and DC magnetic field signal to an audio electroacoustic taking the same as input signals thereof. The audio electroacoustic device comprises a hearing aid, an earphone of a home entertainment system, a public hearing loop system with an embedded hearing device, etc. The TMR near-field magnetic communication system comprises one or more TMR sensor bridges for detecting AC and DC magnetic field signals, an analog-signal circuit containing a filter which is used for separating components of AC and DC signals output by a TMR sensor, (Continued)

an amplifier which is used for amplifying an AC electrical signal, and an analog output used for transmitting the AC electrical signal to the audio electroacoustic device. The TMR sensor can be a linear or nonlinear TMR sensor, and the TMR sensor is designed to have an optimal signal to noise ratio in a specific DC magnetic field.

20 Claims, 7 Drawing Sheets

(56) References Cited

U.S. PATENT DOCUMENTS

| | | | | |
|---|---|---|---|---|
| 2011/0044485 | A1* | 2/2011 | Lin | H04R 25/604 |
| | | | | 381/322 |
| 2014/0098443 | A1* | 4/2014 | Davies | G01R 33/093 |
| | | | | 360/324 |
| 2015/0281852 | A1* | 10/2015 | Sacha | H04R 25/30 |
| | | | | 381/331 |
| 2016/0134960 | A1* | 5/2016 | Den Hartog | H04R 25/55 |
| | | | | 381/323 |

FOREIGN PATENT DOCUMENTS

| | | |
|---|---|---|
| CN | 102331564 A | 1/2012 |
| CN | 202230192 | 5/2012 |
| CN | 102540112 A | 7/2012 |
| CN | 102565727 A | 7/2012 |
| CN | 102621504 A | 8/2012 |
| CN | 103267955 | 8/2013 |
| CN | 203387660 | 1/2014 |
| CN | 103592608 | 2/2014 |
| CN | 103630855 | 3/2014 |
| CN | 103645449 | 3/2014 |
| CN | 104301851 | 1/2015 |
| CN | 204425651 | 6/2015 |
| WO | WO-2013150160 | 10/2013 |
| WO | WO-2016008370 | 1/2016 |

* cited by examiner

TMR NEAR-FIELD MAGNETIC COMMUNICATION SYSTEM

PRIORITY CLAIM TO RELATED APPLICATIONS

This application is a U.S. national stage application filed under 35 U.S.C. § 371 from International Application Serial No. PCT/CN2015/083461, which was filed 7 Jul. 2015, and published as WO2016/008370 on 21 Jan. 2016, and which claims priority to Chinese Application No. 201410334560.0, filed 14 Jul. 2014, which applications and publication are incorporated by reference as if reproduced herein and made a part hereof in their entirety, and the benefit of priority of each of which is claimed herein.

TECHNICAL FIELD

The present invention relates to a device for detecting audio signals in a near-field magnetic communication system, and in particular, to a method of designing and combining tunneling magnetoresistance (TMR) sensors for signal detection, to achieve effects of increasing the signal to noise ratio, improving the working direct current (DC) magnetic field range, reducing the power consumption, and implementing multiple sensing axes.

BACKGROUND ART

At present, a hearing aid mostly utilizes an induction coil-type (T-coil) sound acquisition device to receive an alternating current (AC) magnetic signal from a receiver of a telephone set. When the telephone is used, a T-coil sensor therein can help a user of the hearing aid to eliminate a background signal audible to human ears, and can also avoid deterioration of the sound quality. When an original-sound type hearing aid and a telephone receiver are used at the same time, the deterioration of the sound quality often occurs. The best solution is triggering a magnetic switch in the hearing aid by using a DC magnetic field in the telephone receiver, to turn off the microphone of the hearing aid and activate the T-coil sound acquisition device, instead of turning off the microphone by using a manual switch.

In addition to improving the sound quality of telephone answering, the hearing aid is gradually applied to an advanced consumer audio system and a public broadcast audio transmission system, a T-coil sensor therein, as a detector of a near-field magnetic communication system, has double functions in a loop system. Generally, an analog audio signal in a near-field magnetic communication system, such as a telephone signal pickup system, a public broadcast system, and a home audio, is carried by a magnetic field, and the magnetic field is very close to a transmission coil. This is different from common wireless transmission in several aspects, among which the biggest difference lies in that: the magnetic field for carrying audio signals in the near-field magnetic communication system is not an electromagnetic wave that is easy to spread. Therefore, the near-field magnetic communication may be conducted only in a room or building, which improves the privacy, thus allowing adjacent systems to respectively transmit information only locally.

A conventional induction coil (T-coil) can only detect an AC magnetic field. There are two types of induction coils, one is a passive type consisting of coils wound on a magnetic core, and the other is an active type including a pre-amplifier. However, an inductor for picking up signals is large in size and expensive. In addition, the induction coil cannot sense the existence of a DC magnetic field, and the existence of the DC magnetic field from a near-field communication device must be detected by using an additional circuit. These devices are big, and occupy a large space in the hearing aid which could be used for other applications of the hearing aid or for increasing the battery space. Another defect of the conventional induction coil-type sound acquisition device is that the conventional induction coil-type sensor is a vector type, instead of a scalar type sensor; therefore, it can only measure magnetic field changes in one direction. Being sensitive to a single axis may be good, but the coil is large in size, and the length of the coil along the sensing axis is greater than the length thereof along the non-sensing axis, such that it is difficult to match the conventional T-Coil with a receiver of a fixed-line telephone.

SUMMARY OF THE INVENTION

Therefore, it is necessary to mount a sensor having a small size in a hearing aid, to save the cost, reduce the size, increase more functions or batteries, and improve the performance of a T-coil. A T-coil manufactured by using a TMR sensor is a preferred choice. In addition, a small sensor may enable a loop system to detect two magnetic field components perpendicular to each other, and this solution is increasingly popular. Moreover, as an induction coil cannot detect a DC magnetic field in a receiver of a telephone set, an additional magnetic switch is needed to trigger a T-coil mode. The TMR sensor can detect the DC component, and thus it has a dual-function of sensor/switch. The present invention discloses a method of manufacturing a single-sensitive axis or double-sensitive axis sensor system by using a TMR sensor. The sensor system integrates a magnetic switch, a T-coil, and a loop system unit into a small package.

A TMR near-field magnetic communication system is used for detecting AC and DC magnetic fields generated by a near-field magnetic communication system, and converting the magnetic signals into electrical signals received by an audio electroacoustic device, the TMR near-field magnetic communication system including:

a TMR sensor bridge TMR[A] for detecting a magnetic field;

an analog signal circuit connected to an output of the TMR sensor bridge TMR[A], the analog signal circuit including a filter and an amplifier, the filter separating AC and DC electrical signals output by the TMR sensor bridge TMR[A], the amplifier amplifying the AC electrical signal, and an analog signal output transmitting the amplified AC electrical signal to the audio electroacoustic device; and a power circuit connected to the TMR sensor bridge TMR[A] and the analog signal circuit, and a power input for providing power supply for the power circuit;

the TMR sensor bridge TMR[A] being a low-sensitive linear TMR sensor, a high-sensitive linear TMR sensor, or a non-linear TMR sensor.

Preferably, the TMR near-field magnetic communication system further includes:

a digital signal circuit connected to the TMR sensor bridge TMR[A], the digital signal circuit processing a DC component of the electrical signal output by the TMR sensor TMR[A]; and a digital signal output for transmitting information of the DC component output by the TMR sensor bridge TMR[A] to the audio electroacoustic device.

Preferably, the power circuit includes a duty cycle controller for controlling a high-level duty cycle of the TMR sensor bridge TMR[A]; the digital signal circuit includes a comparator for detecting the existence of a larger DC electrical signal in the signals output by the TMR sensor bridge TMR[A]; when the comparator detects the larger DC electrical signal in the output of the TMR sensor bridge [A], the duty cycle controller stops working, but an output thereof is still a DC bias voltage.

Preferably, the power circuit includes a voltage doubler, and when the comparator detects the larger DC electrical signal in the output of the TMR sensor bridge TMR[A], the voltage doubler is turned on to increase the bias voltage of the TMR sensor bridge TMR[A].

Preferably, a TMR sensor bridge TMR[B] connected to the power circuit is included.

Preferably, the TMR near-field magnetic communication system includes:

a digital signal circuit connected to the TMR sensor bridge TMR[B], for processing a DC electrical signal from the TMR sensor bridge TMR[B], the digital signal circuit including a comparator for detecting a larger DC component in an output of the TMR sensor bridge TMR[B], and when the comparator detects the DC electrical signal in signals output by the TMR sensor bridge TMR[B], the comparator sending a signal to enable the bias voltage of the TMR sensor bridge TMR[A]; and a digital output for transmitting information of the DC component output by the TMR sensor bridge TMR[B] to the audio electroacoustic device;

the resistance of the TMR sensor bridge TMR[B] being greater than that of the TMR sensor bridge TMR[A].

Preferably, the power circuit includes a voltage doubler, and when the comparator detects the DC electrical signal in the output of the TMR sensor bridge TMR[B], the voltage doubler is turned on to increase the bias voltage of the TMR sensor bridge TMR[A].

Preferably, the TMR near-field magnetic communication system includes a TMR sensor bridge TMR[C], the TMR sensor bridge TMR[C] and the TMR sensor TMR[B] respectively detect two magnetic field components in directions perpendicular to each other, and the TMR sensor TMR[C] is a high-sensitive linear TMR sensor for detecting the AC magnetic field.

Preferably, the analog signal circuit is connected to an output of the TMR sensor bridge TMR[C], and the analog signal circuit separates and amplifies an AC electrical signal output by the TMR sensor bridge TMR[C], and transmits the processed AC electrical signal to the analog signal output of the TMR near-field magnetic communication system.

Preferably, the TMR sensor bridge TMR[A] and the TMR sensor bridge TMR[B] are half bridges, full bridges, push-pull bridges, or any combination thereof; the TMR near-field magnetic communication system is packaged into a chip-on-flex package, a multi-chip package (COF), or a chip-on-board package (COB); and the TMR sensor bridge TMR[A] and the TMR sensor bridge TMR[B] are manufactured by using a flip die process.

Preferably, the TMR sensor bridge is a half bridge, a full bridge, a push-pull bridge, or any combination thereof; the TMR near-field magnetic communication system is packaged into a chip-on-flex package (single semiconductor package), a multi-chip package (COF), or a chip-on-board package (COB); and the TMR sensor bridge is manufactured by using a flip die process.

Preferably, the TMR sensor bridge TMR[A] is a non-linear TMR sensor manufactured by using a flip die process, a bias magnetic field of each bridge arm is greater than a saturation magnetic field thereof, and a sum of the bias magnetic field and the saturation magnetic field is equal to the maximum DC magnetic field operated by the TMR sensor bridge TMR[A].

Preferably, the TMR sensor bridge TMR[A] is a non-linear TMR sensor manufactured by using a flip die process, a bias magnetic field of each bridge arm is greater than a saturation magnetic field thereof, and a sum of the bias magnetic field and the saturation magnetic field is equal to the maximum DC magnetic field operated by the TMR sensor bridge TMR[A].

Preferably, the TMR near-field magnetic communication system includes a digital input for manually switching the TMR near-field magnetic communication system between a hearing loop system mode, a T-coil mode, and a standby mode, wherein, in the standby mode, the TMR sensor bridge TMR[A] does not work.

Preferably, the TMR near-field magnetic communication system includes a digital input for manually switching the TMR near-field magnetic communication system between a hearing loop system mode, a T-coil mode, and a standby mode, wherein, in the standby mode, the TMR sensor bridge TMR[A] does not work.

Preferably, the TMR near-field magnetic communication system includes a TMR sensor bridge TMR[C], the TMR sensor bridge TMR[C] and the TMR sensor bridge TMR[A] respectively detect components of two magnetic fields perpendicular to each other, the TMR sensor TMR[C] is a high-sensitive linear TMR sensor for detecting an AC magnetic field, and an output of the TMR sensor bridge TMR[C] is buffered and AC-coupled to the audio amplifier in the analog signal circuit.

Preferably, the TMR near-field magnetic communication system includes a digital signal circuit, the digital signal circuit includes a comparator, the comparator receives a DC electrical signal from outputs of the TMR sensor bridge TMR[C] and the TMR sensor bridge TMR[A], an output of the comparator is connected to the digital signal output, and transmits, through the digital signal output, DC component information of the output signal of the TMR sensor bridge TMR[A] to the audio electroacoustic device.

Preferably, the TMR near-field magnetic communication system includes one or more additional TMR sensor bridges TMR[A1], TMR[A2], TMR[Ai] (i is a positive integer); all the TMR sensors TMR[Ai] each have a different Hsat; all the TMR sensor bridges TMR[Ai] and the TMR sensor bridge TMR[A] detect magnetic field components in the same direction; the TMR sensor bridge TMR[Ai] is a high-sensitive linear TMR sensor, a low-sensitive TMR sensor, or a non-linear TMR sensor; and outputs of the TMR sensor bridge TMR[A] and the TMR sensor bridge TMR[Ai] are buffered and AC-coupled to the audio amplifier in the analog signal circuit.

Preferably, in the TMR near-field magnetic communication system, a bias field of at least one TMR sensor bridge is greater than a saturation field thereof, and the at least one TMR sensor bridge is enabled to operate within a magnetic field range of 10~100 G, to obtain an optimal signal to noise ratio.

Preferably, the TMR near-field magnetic communication system is packaged into a chip-on-flex package (single semiconductor package), a multi-chip package (COF), or a chip-on-board package (COB); and the TMR sensor bridge TMR[A] and the TMR sensor bridge TMR[Ai] (i is a positive integer) are manufactured by using a flip die process.

BRIEF DESCRIPTION OF THE DRAWINGS

To describe the technical solutions in the technologies of embodiments of the present invention more clearly, accompanying drawings that need to be used in the technologies of the embodiments are introduced briefly in the following. Apparently, the accompanying drawings described in the following are only some embodiments of the present invention, and those of ordinary skill in the art can further obtain other accompanying drawings according to the accompanying drawings without any creative efforts.

DETAILED DESCRIPTION

Figure 1:
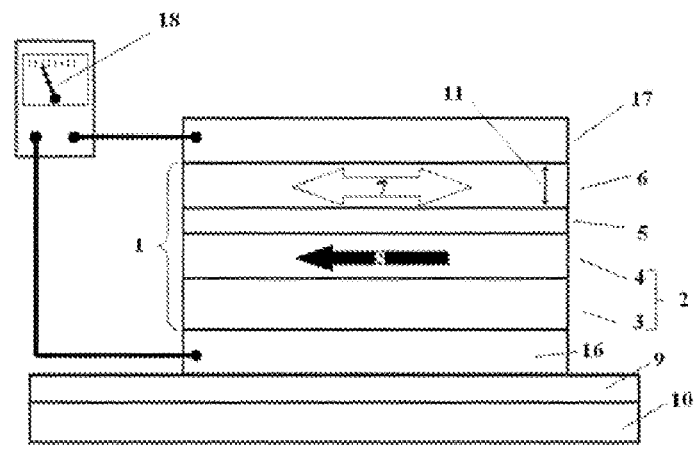
FIG. 1 is a sectional diagram of an MTJ, showing a layer structure of the MTJ and a circuit of a measurement resistor.

FIG. 1 is a schematic diagram of a structure of a magnetic tunneling junction (MTJ) element and measurement of a resistance thereof. A standard MTJ layer structure 1 includes a magnetic pinned layer 2 formed by magnetically coupling a ferromagnetic pinned ruthenium layer 4 and a pinning layer 3 made of an antiferromagnetic material, and a tunnel barrier layer 5 formed by MgO or $Al_2O_3$. The tunnel barrier layer 5 is directly deposited on the ferromagnetic pinned ruthenium layer 4. A ferromagnetic layer 6 is deposited above the tunnel barrier layer 5. Directions of a magnetic moment direction 8 of the magnetic pinned layer 2 and a magnetic moment direction 7 of a sensitive layer are shown as arrows. The magnetization direction 8 of the pinning layer is pinned to a direction relatively fixedly, and will not change in a condition of magnetic field intensity that is not very strong. In comparison, the magnetic moment direction 7 of the sensitive layer may change along with changes of an external magnetic field. A magnetic moment direction 7 of a magnetic free layer 6 is shown by double arrows, and a direction 8 of the pinned layer 4 is shown by a single arrow, for indicating differences in spinning freedom. The typical thicknesses of the layers 3, 4, 5, and 6 are 0.1 nm to more than 10 nm.

Bottom and top electrodes 16 and 17 are in direct contact with MTJ upper layers 3 and 6, for measuring magnetic resistances. The top and bottom electrodes 16 and 17 are generally made of a non-magnetic conductive metal, and must be capable of bearing a current leading to an ohmmeter 18. The ohmmeter 18 applies a known voltage (or current) to the whole layer structure of the MTJ, and measures a current (or voltage) finally passing through the MTJ. Generally, the tunnel barrier layer 5 provides most of the resistance, for example, the resistance of the barrier layer is 10,000 ohms, and the resistance of other parts is 10 ohms. The bottom electrode 16 is located on an insulation layer 9, the insulation layer 9 is formed on a substrate 10, and an edge of the insulation layer 9 extends beyond an edge of the bottom electrode 16. The substrate 10 is most frequently made of silicon, but can also be made of glass, heat-resistant glass, GaAs, AlTiC, or any other material providing suitable wafer integration characteristics. The TMR sensor does not always need an integrated circuit; however, silicon is favored as it is suitable for being processed into integrated circuits.

Figure 2:
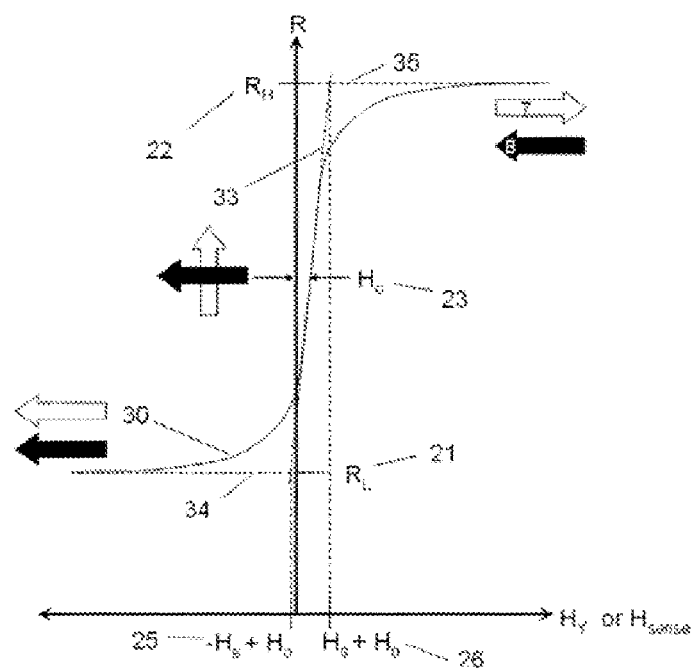
FIG. 2 is a schematic diagram of conversion curves of magnetic resistances of regular spin-valves GMR and TMR changing along with an external magnetic field, wherein a magnetization direction of a pinning layer thereof points to a −H direction.

FIG. 2 is a curve diagram of a resistance of a GMR or an MTJ sensor vs. a common output of an external magnetic field, and a sensor having the curve is applicable to measurement of a linear magnetic field. An output curve 30 is saturated in a low resistance state 21 and a high resistance state 22, RL and RH respectively represents resistance values of the low resistance state 21 and the high resistance state 22. Between the two saturated states, the output curve is a linear curve of an external magnetic field H. A direction of the external magnetic field H is parallel to a sensitive direction of the sensor. When the magnetization direction 8 of the pinning layer is antiparallel to the sensitive direction, the magnetization direction of the pinning layer points to a direction of −H. When the magnetization direction 7 of the magnetic free layer is parallel to the magnetization direction 8 of the magnetic pinning layer, the measured resistance value of the whole element is at the low resistance state 21; and when the magnetization direction 7 of the magnetic free layer is antiparallel to the magnetization direction 8 of the magnetic pinning layer, the measured resistance value of the whole element is at the high resistance state 22. It will be described in the following that when the direction of the free layer 6 relative to the pinned layer 4 is between 0 degree and 180 degrees, the resistance of the MTJ element 1 takes a value between a high resistance and a low resistance.

The output curve 30 is not necessarily symmetric relative to a point H=0. In a typical condition, an offset $H_0$ 23 exists between saturation fields 25 and 26, such that the low saturation field is close to the point H=0. The value of $H_0$ 23 is related to the "orange effect" or "Neel coupling", generally ranges between 1 Oe and 25 Oe, is related to the evenness of a ferromagnetic thin film in the MR element, and also depends on the material and processing process. The $H_0$ 23 may be decreased and increased by magnetically biasing the TMJ element.

To describe the working principle of the TMR near-field magnetic communication system, between the saturation fields 25 and 26, the output curve of FIG. 2 may be expressed approximately as:

$$R(H) = \frac{R_H - R_L}{2H_s}(H - H_0) + \frac{R_H + R_L}{2} \quad (1)$$

$H_s$ is a saturation field. Hs is quantificationally defined as a magnetic field value corresponding to an intersection of a tangent line of an output curve when the magnetic field is a low field and a tangent line of an output curve when the magnetic field is saturated, and the value is obtained when $H_0$ is omitted.

Figure 3:
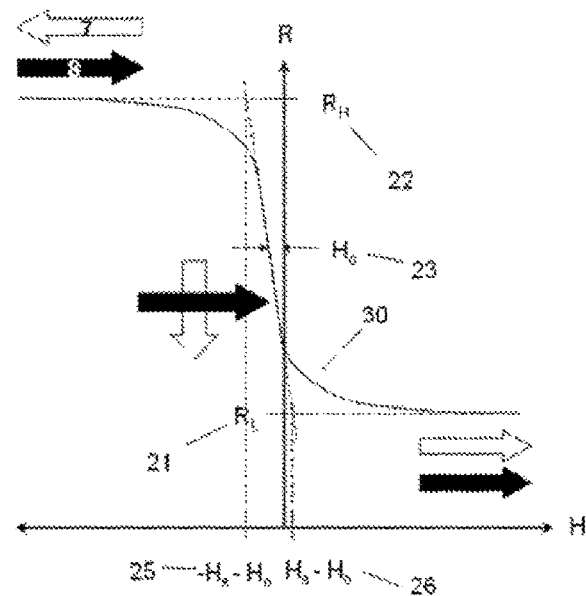
FIG. 3 is a schematic diagram of conversion curves of magnetic resistances of regular spin-valves GMR and TMR changing along with an external magnetic field, wherein a magnetization direction of a pinning layer thereof points to a +H direction.

FIG. 3 is an output curve of a resistance of a die (a wafer is cut into dies each having a sensor) in FIG. 2 rotating by 180 degrees relative to ~an axis perpendicular to the plane of the sensor vs. an external magnetic field, and after rotation, the magnetization direction 8 of the pinned layer now points to a direction of +H. The result of this rotation is that, in the same external magnetic field condition, the slope of the R~H output curve is a negative value of the slope of a die that is not rotated. Only by using this characteristic, can a TMR sensor with a larger output be constructed. This method is used to manufacture the sensor in the embodiment disclosed in the present invention. Manufacturing a linear TMR sensor by using the method of rotating a die has been disclosed in Chinese Patent Applications No. 201310718969.8, No. 201310496945.2), No. 201120167350.9, and No. 201110134982.X.

Figure 4:
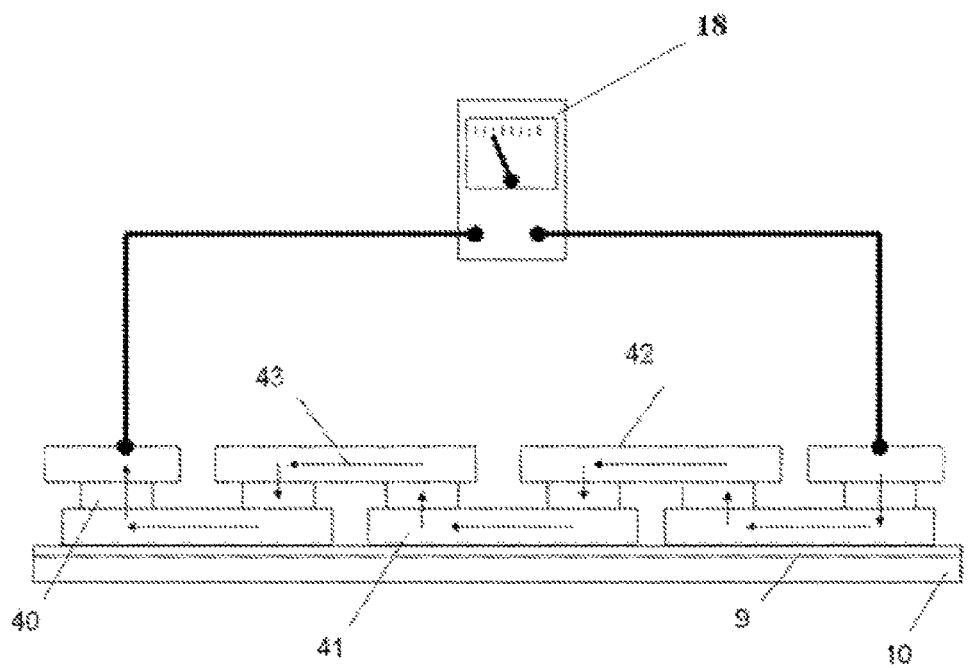
FIG. 4 is a brief diagram of connecting multiple TMR elements into an arm of a bridge.

As shown in FIG. 4, multiple MTJ elements may be used in series as they have a small size, to improve the sensitivity, reduce 1/F noise, and improve the antistatic performance. Multiple electrically connected MTJ elements 40 are located between a bottom element 41 and a top electrode 42, to construct a sandwich structure, and an electrical connection manner thereof enables a current 43 to longitudinally flow through the MTJ 40 and horizontally flow through the top electrode 42 and the bottom electrode 41 alternated at bottom and top conductive layers. The bottom electrode 41 is located on an isolation layer 9 and may have an additional substrate 10. When a bridge design is used, MTJ elements 1 of a reference arm and a sensing arm of the bridge preferably have the same size, and in this way, an offset caused by etching may be eliminated; moreover, by using the design of an element string, different numbers of MTJ elements 40 may be used in the sensing arm and the reference arm, to obtain an optimal sensing arm/reference resistance ratio.

Figure 5:
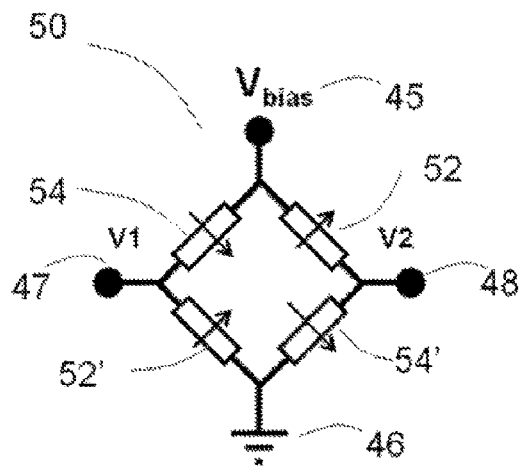
FIG. 5 is a full-bridge TMR sensor consisting of 4 sensing arms.

The bridge is used for converting a resistance conversion signal into a voltage signal that is easily amplified. This can improve the signal to noise ratio, eliminate the common-mode noise, reduce the heat effect, and the like. The MR element string in FIG. 4 can be easily used for constructing a Wheatstone bridge of FIG. 5. A "full bridge" 50 is preferred; 4 arms of the full bridge 50 are all sensitive to an external magnetic field H, and are referred to as sensing arms. Transmission curves of sensing arms 52 and 52' are as shown in FIG. 2, having a positive slope; and transmission curves of sensing arms 54 and 54' are as shown in FIG. 3, having a negative slope. In FIG. 5, directions of arrows above the sensing arms 52 and 54 represent that signs of slopes of conversion curves of resistance values thereof vs. the intensity of the external magnetic field are opposite. In addition, GHP: when the sensor is manufactured on the substrate, the following electrical connection bonding pads are needed: a voltage bias bonding pad ($V_{bias}$ 45), a grounded bonding pad (GND, 46), and central tap bonding pads of two half-bridge circuits ($V_1$, 47, $V_2$, 48). A relationship of an output voltage of a full bridge circuit 50 along with changes of the external magnetic field is shown by a curve 60 in FIG. 6.

Figure 6:
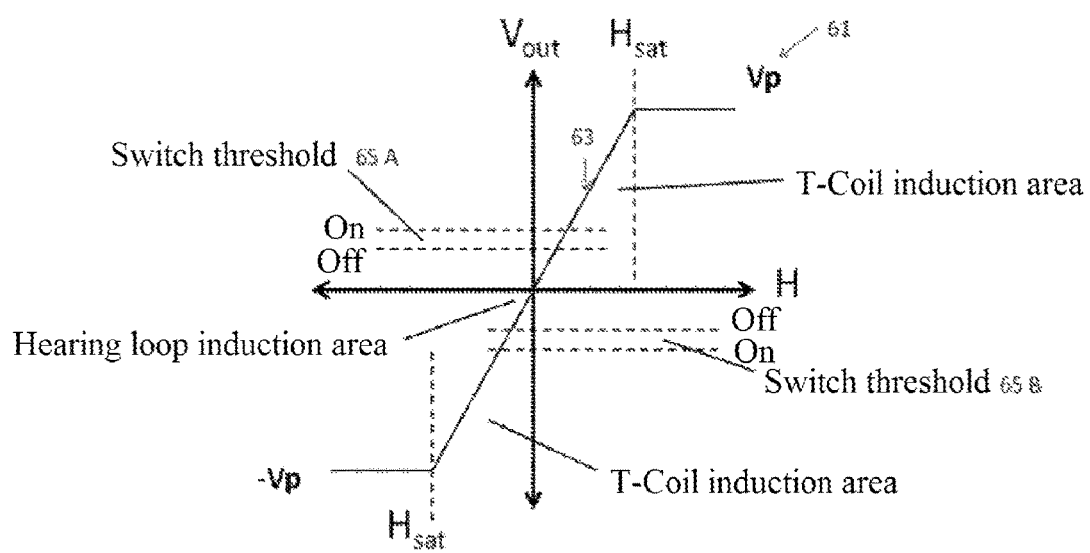
FIG. 6 is a conversion curve of a linear full-bridge TMR sensor.

To derive the curve of FIG. 6 from $R_H$ and $R_L$ of the conversion curves 30 in FIG. 2 and FIG. 3, first, it is necessary to calculate a voltage difference $V_1$-$V_2$ when the external magnetic field H is a large positive value. In this sensing condition, resistances of the sensing arms 52 and 52' are $R_H$; and resistances of 54 and 54' are $R_L$;

the resistance of the bridge from $V_{bias}$ to GND is:

$$R_{net} = \text{Parallel}([R_H + R_L], [R_L + R_H]) = [R_L + R_H]/2 \quad (2)$$

Since two sides of the bridge have equal resistance values, currents at both sides of the bridge should also be identical, and according to a current division relationship, the following formula may be obtained:

$$I_{left} = I_{right} = \frac{1}{2}\frac{V_{bias}}{[R_L + R_H]/2} = \frac{V_{bias}}{[R_L + R_H]} \quad (3)$$

A potential of a point V1 at the left side is:

$$V_1 = R_H \cdot I_{left} = R_H \cdot \frac{V_{bias}}{[R_L + R_H]} \quad (4)$$

A potential of a point V2 at the right side is:

$$V_2 = R_H \cdot I_{right} = R_L \cdot \frac{V_{bias}}{[R_L + R_H]} \quad (5)$$

An output of the TMR sensor bridge is a difference between V1 and V2:

$$V_{OUT} = V_1 - V_2 = R_H \cdot I_{right} = \frac{[R_H - R_L]}{[R_L + R_H]} \cdot V_{bias} \quad (6)$$

When a positive magnetic field is applied externally, the Vout in the above formula is the maximum output value of the TMR sensor bridge, which is marked as Vpeak 61 in FIG. 6. It can be seen from FIG. 6 that, a tangent line 63 passes through the origin, and intersects with a line where a +Vpeak value is located at a point H=Hsat. The sensitivity of the output voltage of the bridge circuit is defined as: when H=0, the slope of the output voltage of the bridge circuit, as shown in the following formula:

$$S = \left(\frac{R_H - R_L}{R_H + R_L}\right)\frac{V_{bias}}{H_{sat}} \quad (7)$$

FIG. 6 shows output curves V1-V2~H of a linear full bridge sensor. A saturation field in FIG. 6 is defined as Hsat, and a bias field of each MTJ element needs to be added to modify the value of the saturation field, as shown in the following formula:

$$H_{sat} = |H_o| + |H_s| \quad (8)$$

It should be noted that Hsat is greater than or equal to $H_s$ of a single MTJ element or of a bridge arm. At the same time, when directions of pinning layers of MTJ elements on adjacent bridge arms of the bridge are opposite, a bias field $H_o$ of a single MTJ element group may be canceled.

When a TMR sensor is used as an audio magnetic field signal collector, two important parameters need to be considered from the perspective of sound quality:
(1) saturation field (Hsat), and
(2) signal to noise ratio (SNR).

Here, the sensitivity is defined as Vp/Hsat. It should be noted that, as the field intensity of the external magnetic field that needs to be measured increases, Hsat must be increased correspondingly. This means that when a stronger external magnetic field is measured, the sensitivity of the TMR sensor needs to be reduced.

A negative effect of reducing the sensitivity is deterioration of the quality of a collected audio magnetic field signal. In an audio range between 100 Hz and 10 KHz, a Johnson noise model can well describe magnetic noise in a TMR sensor, the Johnson noise is integrated in the bandwidth of the T-coil, and then a root-mean-square thereof is obtained:

$$B_{ns} = \sqrt{\int_{F1}^{F2} \left( \frac{\sqrt{4k_B TR}}{\frac{V_p}{\mu_0 H_{sat}}} \right)^2 df} \quad (9)$$

In the formula, F1 is the lowest frequency of a pass band, F2 is the highest frequency, $k_B$ is a Boltzmann content, T is the temperature, and R represents the resistance of the bridge of the TMR sensor. A signal to noise ratio representing the measured signal quality relative to an amplitude Btest of a measured sound wave may be expressed as:

$$SNR = 20 \text{Log}\left( \frac{B_{test}}{B_{ns}} \right) \quad (10)$$

As Hsat increases, SNR decreases.

When a TMR sensor having a high signal to noise ratio is designed, there are other factors that need to be taken into account. Vp should be smaller than a bias voltage (Vbias) of the TMR sensor, and be related to the structure of the bridge and a resistance change rate of the TMR sensor. The resistance change rate of the TMR sensor has an actual limit, and Vp can only be close to the bias voltage of the TMR sensor but cannot be equal to the bias voltage of the TMR sensor. Actually, in the best condition, by using a push-pull full bridge as an example, 0.45 Vbias<=Vp<=Vbias. The optimal sensitivity of the push-pull full bridge TMR sensor is:

$$S \approx 0.5 \frac{V_{bias}}{H_{sat}} \quad (11)$$

Vbias and Hsat are limited by actual considerations of the DC magnetic field and the power consumption. Therefore, the highest sensitivity is limited by the design, and even if the slope of the linear transmission curve is improved, the sensitivity cannot be improved significantly.

Definitely, the noise of the TMR sensor may also affect the SNR, and therefore, reduction of the noise of the TMR sensor may also be considered. It can be known from the above introduction that, Bns is decided by the bandwidth, but it is decided by human voice and music that the bandwidth of the audio magnetic field signal cannot be changed. Although the noise is reduced along with the temperature, we cannot control the temperature. Finally, the noise is reduced as the resistance is reduced. However, reducing the resistance of the TMR sensor may increase the power consumption, reduce the service life of a battery, and therefore, the resistance cannot be designed to be too low.

Parameters affecting the SNR may be summarized in the following formulas, $$SNR = 20 \text{Log}\left( \frac{B_{test}}{\sqrt{\int_{F1}^{F2} \left( \frac{\sqrt{4k_B TR}}{\frac{V_p}{\mu_0 H_{sat}}} \right)^2 df}} \right) \quad (12)$$

$$SNR = 20 \text{Log}\left( \frac{B_{test} V_p}{\mu_0 H_{sat} 4 k_B TR \sqrt{F_2 - F_1}} \right) \quad (13)$$

Assume that Vp~0.5$V_{bias}$ $$SNR = 20 \text{Log}\left( \frac{B_{test} V_{bias}}{\mu_0 H_{sat} 8 k_B TR \sqrt{F_2 - F_1}} \right) \quad (14)$$

By setting smaller R and Hsat, and larger Vbias, the SNR may be optimized. However, the optimization is limited by actually feasible values of R, Hsat, and Vbias. In a telephone set system, the minimum value of Hsat is about 35 Oe, and therefore, only R and Vbias are changed. However, the smaller R and the larger Vbias may cause greater power consumption; therefore, the SNR of the linear TMR sensor as shown in FIG. 6 is limited by possible actual values of parameters thereof.

It should be noted that, in a telephone set application, the TMR near-field magnetic communication system will be used only after it is close to the telephone set. The magnetic sensor is generally used as a proximity switch to detect the existence of the telephone set. The DC magnetic field in the receiver of the telephone set may trigger the magnetic switch, such that the magnetic switch is turned on when the intensity of the magnetic field is less than 10 Oe, and therefore, there are two methods of improving the SNR without increasing the power consumption.

In one solution, when a T-coil sensor needs to be used, a high-sensitivity high-resistance value linear sensor is used as a magnetic switch to turn on a low-resistance linear TMR T-coil sensor. As shown in FIG. 6, in an area between two switch threshold intervals 65A and 65B, the TMR T-coil sensor does not work.

Figure 7:
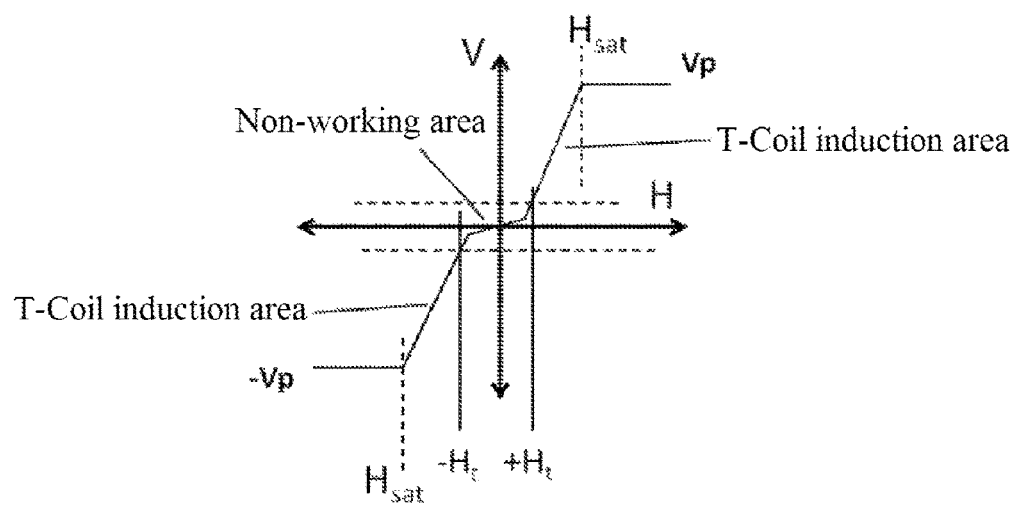
FIG. 7 is a conversion curve of a non-linear full-bridge TMR sensor.

In the other solution, a conversion curve of magnetic field vs. voltage of the TMR T-coil is changed, such that the curve is flatter (an area between two dotted lines) when the intensity of the magnetic field is less than 10 Oe, and the curve is steeper (an area beyond the two dotted lines) when the intensity of the magnetic field is about 10 Oe to 100 Oe. This solution is shown in FIG. 7. When the TMR sensor collects audio magnetic field signals in this range, the sensitivity thereof is expressed as:

$$S \approx 0.5 \frac{V_{bias}}{H_{sat} - H_t} \quad (15)$$

The sensitivity is higher than the sensitivity of the high-sensitivity linear TMR sensor. This TMR sensor is advantageous in that: it has a high sensitivity in a magnetic field range of signals that need to be collected, and may have a higher resistance value to reduce the power consumption. This TMR sensor may be implemented by enabling $$H_o > H_s \quad (16)$$

The method of implementing $H_o > H_s$ includes Neel coupling, disposing a bias permanent magnet on a substrate, or exchange coupling. When exchange coupling is used, a second anti-ferromagnetic layer deposited on a free layer is used for generating a bias magnetic field.

For the purpose of the present invention, the "high-sensitive linear sensor" is defined as a linear sensor with Hsat<10 Oe, the "low-sensitive linear sensor" or the linear TMR sensor is defined as a linear sensor with Hsat>20 Oe. The high-sensitive TMR sensor may be used for a hearing loop system, a cellphone audio magnetic field signal collection, or a magnetic switch.

The present invention uses three different types of TMR sensors,
i. a high-sensitive linear sensor
ii. a low-sensitive linear sensor
iii. a non-linear TMR sensor, to serve as a telephone audio magnetic field signal collector having a high SNR and low power consumption.

The above several types of TMR sensors may form several combinations having different functions, for use in a telephone audio magnetic field signal collector or a hearing loop system.

The linear TMR sensor of i and ii may use various different designing methods, including a reference bridge TMR sensor, related technologies of which may be obtained with reference to MDT2011.15 (CN102621504A), MDT2013.07.30 (201310719255.9), or MDT2013.01.14 (201310203311.3), a quasi-push-pull bridge linear TMR sensor, related technologies of which may be obtained with reference to MDT2011.09 (CN102331564A) or MDT2011.11 (CN102540112A), the non-linear TMR sensor in iii must use a design method of reversing a pinning layer, which is disclosed in MDT2013.09.15.X (201310718969.8), MDT2013.08.20.X, MDT2011.24 (CN202230192U), MDT2011.06 (CN102208530A), MDT2011.05 (CN102298125A) (CN102298125A), or MDT2011.11.30 (CN102565727A).

The hearing aid generally includes a microphone, a sound amplifier, and a receiver. The microphone receives the sound and converts the sound into an electrical signal, the sound amplifier amplifies the electrical signal from the microphone, and the amplified electrical signal is transmitted to the receiver. The receiver converts the electrical signal into a sound signal that is transmitted back to human ears. When a user uses the telephone, the user may want to turn off the microphone, to receive an AC magnetic field generated by the receiver of the telephone. Turning on the TMR T-Coil and turning off the microphone may be implemented manually, and may also be implemented by a magnetic switch that detects a DC magnetic field generated by the receiver of the telephone. The present invention will be described in detail with reference to 4 embodiments in the following.

Embodiment 1

Figure 8:
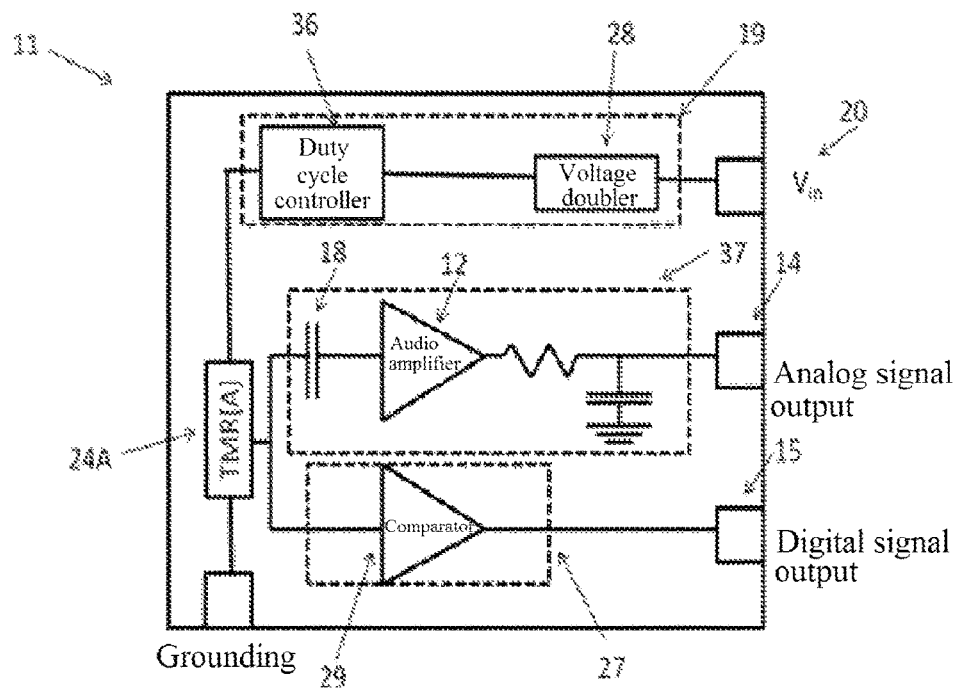
FIG. 8 is a TMR near-field magnetic communication system using only one TMR sensor.

FIG. 8 is Embodiment 1. A TMR near-field magnetic communication system 11 capable of detecting a magnetic field includes: a TMR sensor bridge TMR[A]24A for detecting a magnetic field; an analog signal circuit 37 connected to an output of the TMR sensor bridge TMR[A]24A, the analog signal circuit 37 including a filter 18 and an amplifier 12, the filter 18 being capable of separating AC and DC signals of the TMR sensor bridge TMR[A]24A, and the amplifier 12 amplifying the AC signal; an analog signal output 14 for transmitting the AC signal to an audio electroacoustic device; a power circuit 19 connected to the TMR sensor bridge TMR[A]24A and the analog signal circuit 37; and a power input 20 for providing power supply for the power circuit 19. The TMR sensor bridge TMR[A]24A is a low-sensitive linear TMR sensor, a high-sensitive linear TMR sensor, or a non-linear TMR sensor.

The TMR near-field magnetic communication system 11 further includes a digital signal circuit 27 connected to the TMR sensor bridge TMR[A]24A, which can process the DC signal output by the TMR sensor bridge TMR[A]24A. The electrical signal processed by the digital signal circuit 27 is transmitted to the audio electroacoustic device through the digital output 15. Moreover, the digital signal circuit 27 includes a comparator 29 which may detect the existence of the DC component in the output signal of the TMR sensor bridge TMR[A]24A. A duty cycle controller 36 may control a high-level duty cycle ratio of a bias voltage of the TMR sensor bridge TMR[A]24A, and when the comparator 29 detects the DC magnetic field in the output of the TMR sensor bridge TMR[A]24A, the duty cycle controller 36 may be turned off. In addition, the power circuit 19 includes a voltage doubler 28, which may increase the bias voltage of the TMR sensor bridge TMR[A]24A; and when the comparator 29 detects a larger DC magnetic field in the output of the TMR sensor bridge TMR[A]24A, the voltage doubler 28 may be turned on.

In the first embodiment, the TMR sensor bridge TMR[A]24A is a half bridge, a full bridge, a push-pull bridge, or any combination thereof. The TMR T-Coil near-field magnetic communication system may be packaged into a flexible chip-on-board package (COF), a multi-chip package (single semiconductor package), or a chip-on-board package (COB). The TMR sensor is manufactured by using a flip die technology or a single die technology.

Embodiment 2

Figure 9:
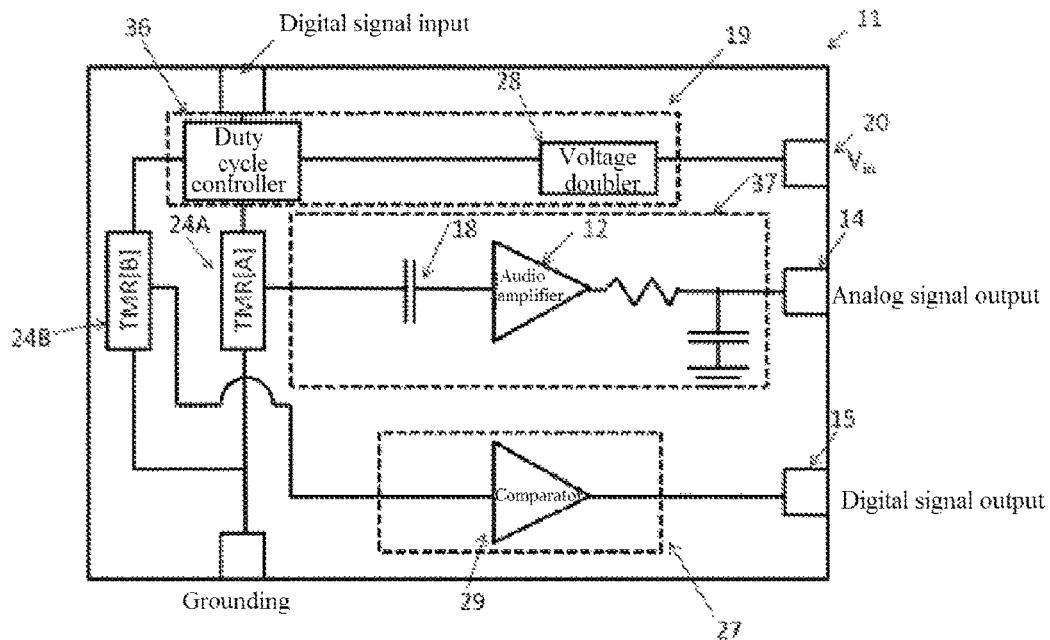
FIG. 9 is a TMR near-field magnetic communication system using two TMR sensors, in which one is dedicated to collecting a telephone audio magnetic field signal.

FIG. 9 is the second embodiment. The TMR near-field magnetic communication system 11 includes: a TMR sensor bridge TMR[A]24A for measuring a magnetic field; an analog signal circuit 37 connected to an output of the TMR sensor bridge TMR[A]24A, the analog signal circuit 37 including a filter 18 and an amplifier 12, the filter 18 being capable of separating AC and DC electrical signals of the TMR sensor bridge TMR[A]24A, and the amplifier 12 amplifying the AC electrical signal; an analog signal output 14 for transmitting the AC electrical signal to an audio electroacoustic device; a power circuit 19 connected to the TMR sensor bridge TMR[A]24A and the analog signal circuit 37; and a power input 20 for providing power supply for the power circuit 19 of the TMR near-field magnetic communication system 11. The TMR sensor bridge TMR[A]24A is a low-sensitive linear TMR sensor, or a non-linear TMR sensor.

The TMR near-field magnetic communication system 11 further includes a TMR sensor bridge TMR[B]24B, and the TMR sensor bridge TMR[B]24B is a high-sensitive or low-sensitive linear TMR sensor, capable of detecting a DC magnetic field in a receiver of a telephone set. The TMR sensor bridge TMR[A]24A and the TMR sensor bridge TMR[B]24B detect magnetic field components in the same direction.

The TMR near-field magnetic communication system 11 further includes: a digital signal circuit 27 connected to the TMR sensor bridge TMR[B]24B, which can process the DC electrical signal from the TMR sensor bridge TMR[B]24B; and a digital output 15 for transmitting DC information of the TMR sensor bridge TMR[A]24A to the audio electroacoustic device. The digital signal circuit 27 includes a comparator 29 which may detect the existence of the DC component in the output signal of the TMR sensor bridge TMR[B]24B. A duty cycle controller 36 may control a high-level duty cycle ratio of a bias voltage of the TMR sensor bridge TMR[B]24B. The power circuit 19 includes a voltage doubler 28, which may increase the bias voltage of the TMR sensor bridge TMR[A]24A; and when the comparator 29 detects a larger DC component in the output of the TMR sensor bridge TMR[B]24B, the voltage doubler 28 may be turned on to increase the bias voltage of the TMR sensor bridge TMR[A]24A.

The TMR near-field magnetic communication system 11 may further include a digital signal input, for manually switching the TMR near-field magnetic communication system 11 between a hearing loop system mode, a T-coil mode, and a standby mode, wherein, in the standby mode, the TMR T-coil does not work.

Embodiment 3

Figure 10:
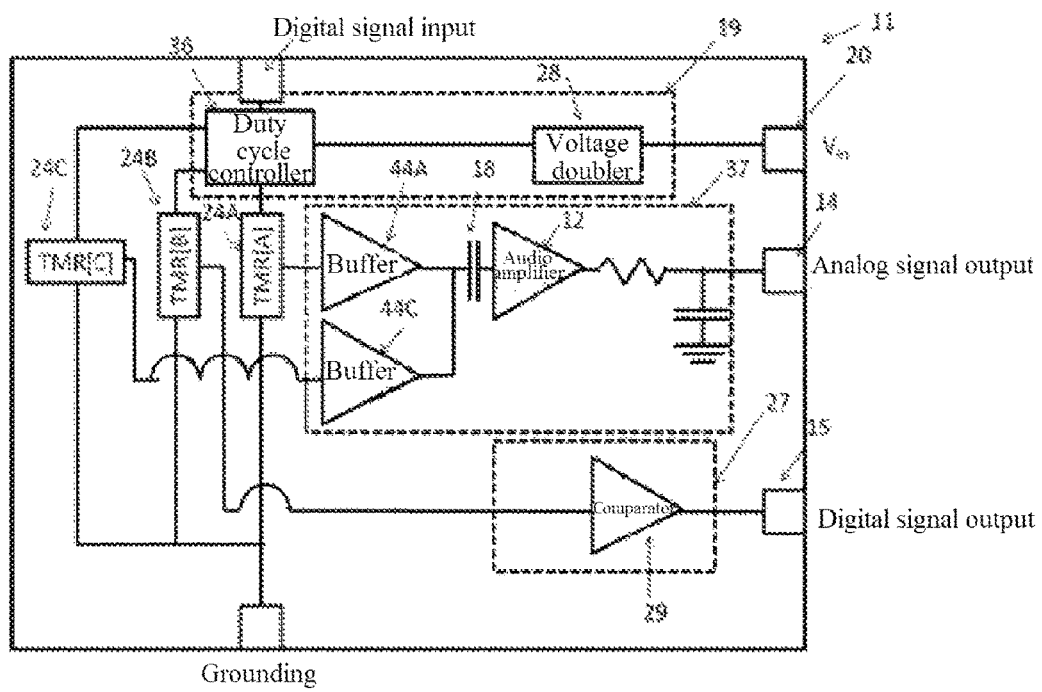
FIG. 10 is a TMR near-field magnetic communication system using three TMR sensors, in which one is dedicated to collecting a telephone audio magnetic field signal, and at least one is dedicated to collecting a hearing loop magnetic field signal.

FIG. 10 is Embodiment 3. The TMR near-field magnetic communication system 11 includes: a TMR sensor bridge TMR[A]24A for detecting a magnetic field; an analog signal circuit 37 connected to an output of the TMR sensor bridge TMR[A]24A, the analog signal circuit 37 including a filter 18 and an amplifier 12, the filter 18 being capable of separating AC and DC electrical signals of the TMR sensor bridge TMR[A]24A, and the amplifier 12 amplifying the AC electrical signal; an analog signal output 14 for transmitting the AC electrical signal to an audio electroacoustic device; a power circuit 19 connected to the TMR sensor bridge TMR[A]24A and the analog signal circuit 37; a power input 20 for providing power supply for the power circuit 19. The TMR sensor bridge TMR[A]24A is a low-sensitive linear TMR sensor, or a non-linear TMR sensor.

The TMR near-field magnetic communication system 11 further includes a TMR sensor bridge TMR[B]24B, the TMR sensor bridge TMR[B]24B is a high-sensitivity or low-sensitivity linear TMR sensor, capable of detecting a DC magnetic field in a receiver of a telephone set. The TMR sensor bridge TMR[A]24A and the TMR sensor bridge TMR[B]24B detect magnetic field components of the same direction. The power supply of the TMR sensor bridge TMR[B]24B may be a power source signal after being chopped by the duty cycle controller, to reduce energy consumption.

The TMR near-field magnetic communication system 11 further includes: a digital signal circuit 27 connected to the TMR sensor bridge TMR[B]24B, which can process the DC signal from the TMR sensor bridge; and a digital output 15 for transmitting DC signal information of the TMR sensor bridge TMR[A]24A to the audio electroacoustic device. The digital signal circuit 27 includes a comparator 29 which may detect the existence of the DC component in the output signal of the TMR sensor bridge TMR[B]24B. A duty cycle controller 36 in the power circuit 19 may control a high-level duty cycle ratio of a bias voltage of the TMR sensor bridge TMR[B]24B. Moreover, the power circuit 19 includes a voltage doubler 28, which can increase the bias voltage of the TMR sensor bridge TMR[A]24A; and when the comparator 29 detects a larger DC component in the output of the TMR sensor bridge TMR[B]24B, the voltage doubler 28 may be turned on.

The TMR near-field magnetic communication system 11 further includes a TMR sensor bridge TMR[C]24C, the TMR sensor bridge TMR[C]24C and the TMR sensor bridge TMR[B]24B detect two magnetic field components perpendicular to each other, and the TMR sensor bridge TMR[C]24C is a high-sensitivity linear TMR sensor, for detecting an AC magnetic field.

The analog signal 37 further includes: a buffer 44C connected to the output of the TMR sensor bridge TMR[C]24C; the filter 18 separates the AC electrical signal of the TMR sensor bridge TMR[C]24C; the amplifier 12 amplifies the AC electrical signal, and transmits the amplified signal to the analog signal output 14 of the TMR near-field magnetic communication system 11. In addition, a buffer 44A is connected to the output of the TMR sensor bridge TMR[A]24A, such that it is well signal-isolated from the TMR sensor bridge TMR[C]24C.

The power circuit 19 includes a voltage doubler 28 to increase bias voltages of the TMR sensor bridges TMR[A]24A and TMR[C]24C; and only when the comparator 29 detects a DC component of an adequate intensity in the output of the TMR sensor bridge TMR[B]24B, can the voltage doubler 28 be turned on.

The TMR sensor bridge TMR[A]24A, the TMR sensor bridge TMR[B]24B and the TMR sensor bridge TMR[C]24C are half bridges, full bridges, push-pull bridges, or any combinations thereof.

The TMR near-field magnetic communication system 11 may further include another digital signal input, for manually switching the TMR near-field magnetic communication system 11 between a hearing loop system mode, a T-coil mode, and a standby mode. In the standby mode, the TMR T-coil does not work.

The TMR T-Coil near-field magnetic communication system may be packaged into a flexible chip-on-board package (COF), a multi-chip package (single semiconductor package), or a chip-on-board package (COB).

Embodiment 4

Figure 11:
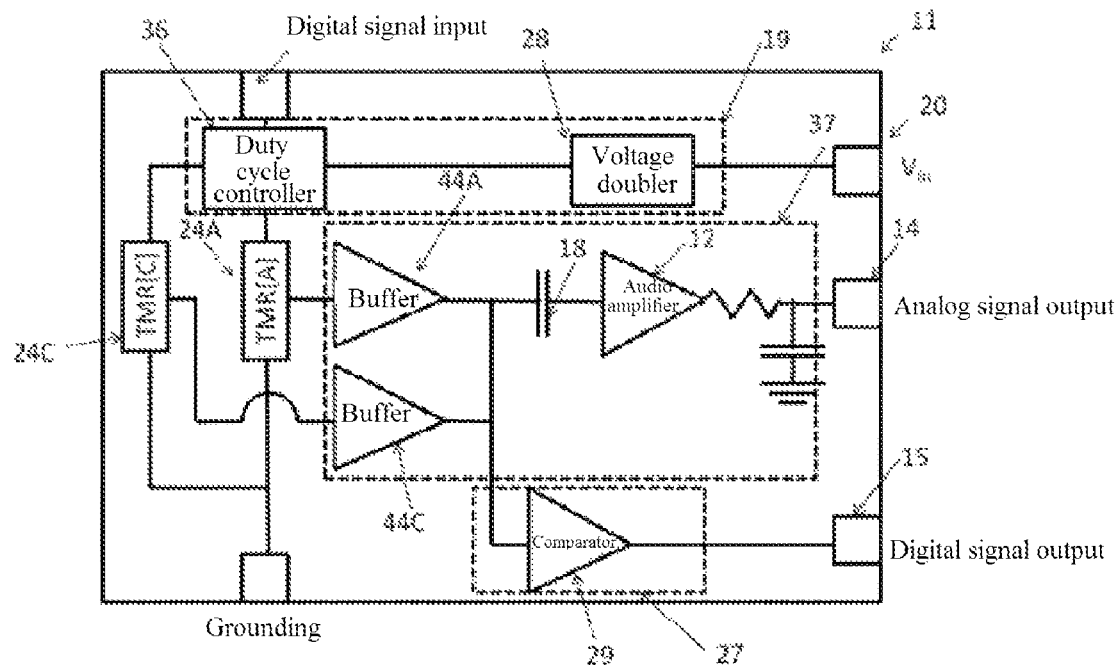
FIG. 11 is a TMR near-field magnetic communication system using two TRM sensors respectively detecting components of two magnetic fields perpendicular to each other, in which one is dedicated to collecting a telephone audio magnetic field signal, and at least one is dedicated to collecting a hearing loop magnetic field signal.

FIG. 11 is Embodiment 4; the TMR near-field magnetic communication system 11 is used for detecting AC and DC magnetic fields of the near-field magnetic communication system, and converting the AC and DC magnetic fields into electrical signals acceptable by an audio electroacoustic device. The TMR near-field magnetic communication system 11 includes a pair of TMR sensors arranged at an angle of 90 degrees and capable of respectively detecting two magnetic field components perpendicular to each other. This pair of TMR sensors include the TMR sensor bridge TMR[A]24A and the TMR sensor bridge TMR[C]24C. Outputs of the TMR sensor bridge TMR[A]24A and the TMR sensor bridge TMR[C]24C are each connected to a respective buffer, and AC and DC electrical signals are separated by using filters thereof; moreover, the AC electrical signals of the two sensors are amplified by the amplifiers 12. The analog signal output 14 is used for transmitting the AC electrical signal to the audio electroacoustic device. The power circuit 19 is connected to the TMR sensor bridges TMR[A]24A and TMR[C]24C, and the analog signal circuit 37. The power input 20 provides power supply for the power circuit 19 of the TMR near-field magnetic communication system 11. The TMR sensor bridges TMR[A]24A and TMR[C]24C are low-sensitive linear TMR sensors, high-sensitive linear TMR sensors, or non-linear TMR sensors.

The TMR near-field magnetic communication system 11 includes a digital signal circuit 27, the digital signal circuit 27 includes a comparator 29, and DC output signals of the TMR sensor bridges TMR[A]24A and TMR[C]24C are transmitted to the comparator 29. An output of the comparator 29 is connected to a digital output 15, and the digital output 15 transmits DC signal information of the TMR sensor bridges TMR[A]24A and TMR[C]24C to the audio electroacoustic device.

The power circuit 19 may include a voltage doubler 28, which may increase bias voltages of the TMR sensor bridges TMR[A]24A and TMR[C]24C. When the comparator 29 detects that there are enough DC components in outputs of the TMR sensor bridges TMR[A]24A and TMR[C]24C, the voltage doubler 28 may be turned on. The power circuit 19 may include a duty cycle controller 36, and when there are insufficient DC components in the outputs of the TMR sensor bridges TMR[A]24A and TMR[C]24C, the controller controls high-level duty cycle ratios of the bias voltages of the TMR sensor bridges TMR[A]24A and TMR[C]24C.

The TMR sensor bridges TMR[A]24A, TMR[B]42B and TMR[C]24C are half bridges, full bridges, push-pull bridges, or any combinations thereof.

The TMR near-field magnetic communication system 11 may include another digital signal input, for manually switching the TMR near-field magnetic communication system 11 between a hearing loop system mode, a T-coil mode, and a standby mode. In the standby mode, the TMR T-coil does not work.

The TMR T-Coil near-field magnetic communication system may be packaged into a flexible chip-on-board package (COF), a multi-chip package (single semiconductor package), or a chip-on-board package (COB).

Embodiment 5

Figure 12:
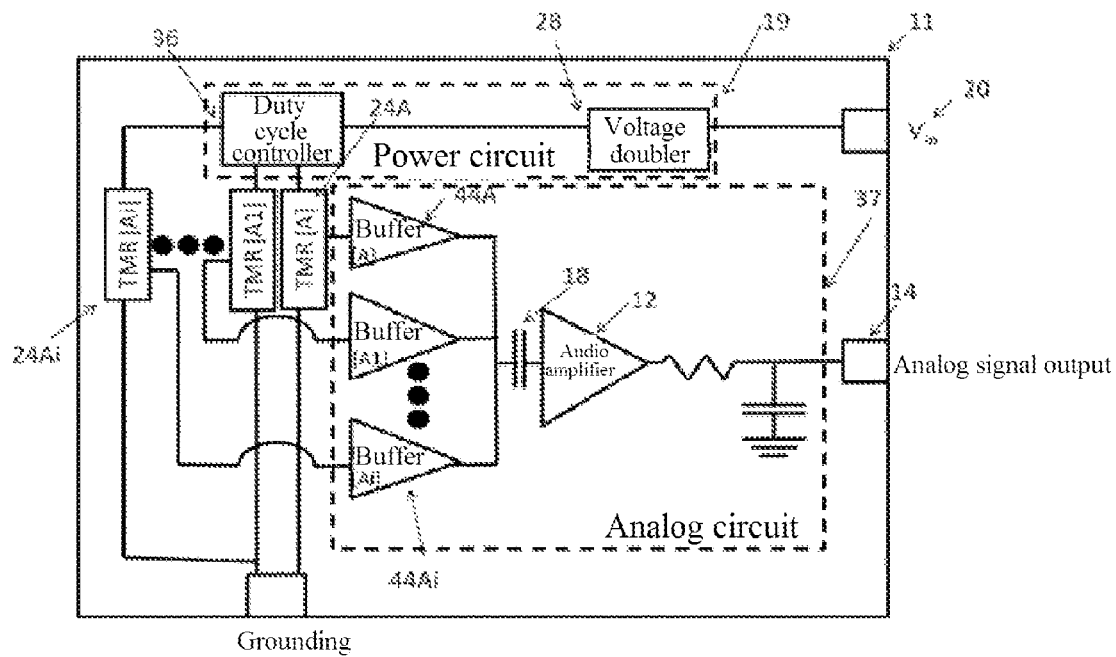
FIG. 12 is a TMR near-field magnetic communication system using multiple TMR sensors each having a different Hsat, which increases a DC magnetic field threshold range of a detectable AC magnetic field, and an AC magnetic field signal exceeding the DC magnetic field threshold is detectable.
Figure 13:
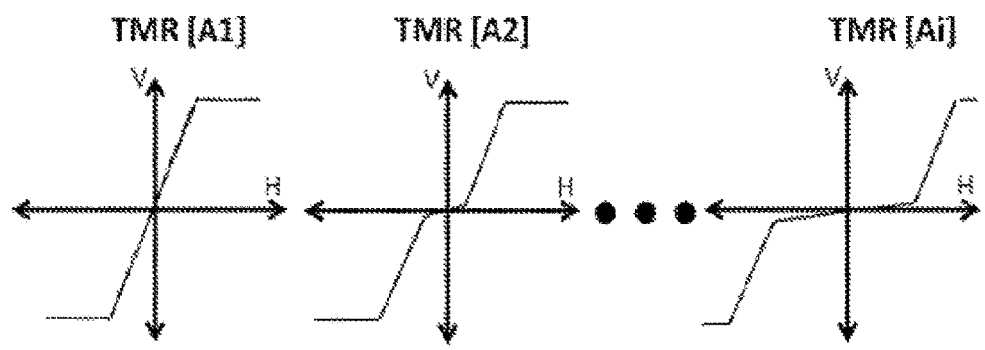
FIG. 13 shows multiple optional TMR sensors, which expands a DC magnetic field threshold range of a detectable AC magnetic field, and an AC magnetic field signal can be detected by using a high-sensitive TMR sensor.

FIG. 12 is Embodiment 5. To expand a DC magnetic field threshold range in AC magnetic field detection, the TMR near-field magnetic communication system 11 further includes several additional TMR sensors TMR[A1], TMR[A2], . . . , TMR[Ai] (i is a positive integer) for detecting magnetic field components in the same direction, and sensitive directions of the additional TMR sensors TMR[A1], TMR[A2], . . . , TMR[Ai] (i is a positive integer) are the same as that of the TMR sensor TMR[A]. A power circuit 19 provides power, and an output of each sensor is connected to an input of an analog signal circuit 37 with buffer input. These TMR sensors each have a different Hsat, and distribution of Hsat is as shown in FIG. 13. This design enables that the AC magnetic field can be smoothly measured in a wide DC magnetic field range. The power circuit 19 may include a voltage doubler 28 for improving the sensitivity of the TMR sensor and a duty cycle controller 36 for reducing the power consumption. An output of each TMR sensor is output to a high-pass filter 18 through a buffer, each output of the filter 18 is electrically connected to the amplifier 12, the amplifier 12 amplifies the AC electrical signal from the TMR sensor, and the analog output 14 transmits the processed AC electrical signal to the audio electroacoustic device.

The above descriptions are merely embodiments of the present invention, and are not intended to limit the present invention. For those skilled in the art, the present invention may have various modifications and changes. Any modification, equivalent replacement, improvement and the like without departing from the spirit and principle of the present invention should all fall within the protection scope of the present invention.

The invention claimed is:

1. A tunneling magnetoresistance (TMR) near-field magnetic communication system used for detecting AC and DC magnetic fields generated by a near-field magnetic communication system, and converting magnetic signals into electrical signals received by an audio electroacoustic device, the TMR near-field magnetic communication system comprising:
   a TMR sensor bridge TMR[A] for detecting a magnetic field;
   an analog signal circuit connected to an output of the TMR sensor bridge TMR[A], the analog signal circuit comprising a filter and an amplifier, the filter separating AC and DC electrical signals output by the TMR sensor bridge TMR[A], the amplifier amplifying the AC electrical signal, and an analog signal output transmitting the amplified AC electrical signal to the audio electroacoustic device; and
   a power circuit connected to the TMR sensor bridge TMR[A] and the analog signal circuit, and a power input for providing power supply for the power circuit;
   wherein the TMR sensor bridge TMR[A] is a low-sensitive linear TMR sensor, a high-sensitive linear TMR sensor, or a non-linear TMR sensor.

2. The TMR near-field magnetic communication system according to claim 1, comprising:
   a digital signal circuit connected to the TMR sensor bridge TMR[A], the digital signal circuit processing a DC component of the electrical signal output by the TMR sensor TMR[A]; and
   a digital signal output for transmitting information of the DC component output by the TMR sensor bridge TMR[A] to the audio electroacoustic device.

3. The TMR near-field magnetic communication system according to claim 2,
   wherein the power circuit comprises a duty cycle controller for controlling a high-level duty cycle of the TMR sensor bridge TMR[A];
   wherein the digital signal circuit comprises a comparator for detecting the existence of a larger DC electrical signal in the signals output by the TMR sensor bridge TMR[A]; and
   wherein, when the comparator detects the larger DC electrical signal in the output of the TMR sensor bridge [A], the duty cycle controller stops working, but an output thereof is still a DC bias voltage.

4. The TMR near-field magnetic communication system according to claim 3, wherein the power circuit comprises a voltage doubler, and when the comparator detects the larger DC electrical signal in the output of the TMR sensor bridge TMR[A], the voltage doubler is turned on to increase the bias voltage of the TMR sensor bridge TMR[A].

5. The TMR near-field magnetic communication system according to claim 1, comprising a TMR sensor bridge TMR[B] connected to the power circuit.

6. The TMR near-field magnetic communication system according to claim 5, comprising:
  a digital signal circuit connected to the TMR sensor bridge TMR[B] for processing a DC electrical signal from the TMR sensor bridge TMR[B], the digital signal circuit comprising:
    a comparator for detecting a larger DC component in an output of the TMR sensor bridge TMR[B], and when the comparator detects the DC electrical signal in signals output by the TMR sensor bridge TMR[B], the comparator sending a signal to enable the bias voltage of the TMR sensor bridge TMR[A]; and
    a digital output for transmitting information of the DC component output by the TMR sensor bridge TMR[B] to the audio electroacoustic device;
  wherein the resistance of the TMR sensor bridge TMR[B] being greater than the resistance of the TMR sensor bridge TMR[A].

7. The TMR near-field magnetic communication system according to claim 6, wherein the power circuit comprises a voltage doubler, and when the comparator detects the DC electrical signal in the output of the TMR sensor bridge TMR[B], the voltage doubler is turned on to increase the bias voltage of the TMR sensor bridge TMR[A].

8. The TMR near-field magnetic communication system according to claim 5, comprising a TMR sensor bridge TMR[C], the TMR sensor bridge TMR[C] and the TMR sensor TMR[B] respectively detecting two magnetic field components in directions perpendicular to each other, and the TMR sensor TMR[C] being a high-sensitive linear TMR sensor for detecting the AC magnetic field.

9. The TMR near-field magnetic communication system according to claim 8, wherein the analog signal circuit is connected to an output of the TMR sensor bridge TMR[C], the analog signal circuit separates and amplifies an AC electrical signal output by the TMR sensor bridge TMR[C], and transmits the processed AC electrical signal to the analog signal output of the TMR near-field magnetic communication system.

10. The TMR near-field magnetic communication system according to claim 1, wherein the TMR sensor bridge TMR[A] and the TMR sensor bridge TMR[B] are half bridges, full bridges, push-pull bridges, or any combination thereof; the TMR near-field magnetic communication system is packaged into a chip-on-flex package, a multi-chip package, or a chip-on-board package; and the TMR sensor bridge TMR[A] and the TMR sensor bridge TMR[B] are manufactured by using a flip die process.

11. The TMR near-field magnetic communication system according to claim 8, wherein the TMR sensor bridge is a half bridge, a full bridge, a push-pull bridge, or any combination thereof; the TMR near-field magnetic communication system is packaged into a chip-on-flex package, a multi-chip package, or a chip-on-board package; and the TMR sensor bridge is manufactured by using a flip die process.

12. The TMR near-field magnetic communication system according to claim 10, wherein the TMR sensor bridge TMR[A] is a non-linear TMR sensor manufactured by using a flip die process, a bias magnetic field of each bridge arm is greater than a saturation magnetic field thereof, and a sum of the bias magnetic field and the saturation magnetic field is equal to the maximum DC magnetic field operated by the TMR sensor bridge TMR[A].

13. The TMR near-field magnetic communication system according to claim 11, wherein the TMR sensor bridge TMR[A] is a non-linear TMR sensor manufactured by using a flip die process, a bias magnetic field of each bridge arm is greater than a saturation magnetic field thereof, and a sum of the bias magnetic field and the saturation magnetic field is equal to the maximum DC magnetic field operated by the TMR sensor bridge TMR[A].

14. The TMR near-field magnetic communication according to claim 1, comprising a digital input for manually switching the TMR near-field magnetic communication system between a hearing loop system mode, a T-coil mode, and a standby mode, wherein in the standby mode, the TMR sensor bridge TMR[A] does not work.

15. The TMR near-field magnetic communication system according to claim 8, comprising a digital input for manually switching the TMR near-field magnetic communication system between a hearing loop system mode, a T-coil mode, and a standby mode, wherein, in the standby mode, the TMR sensor bridge TMR[A] does not work.

16. The TMR near-field magnetic communication system according to claim 1, comprising a TMR sensor bridge TMR[C], the TMR sensor bridge TMR[C] and the TMR sensor bridge TMR[A] respectively detecting components of two magnetic fields perpendicular to each other, the TMR sensor TMR[C] being a high-sensitive linear TMR sensor for detecting an AC magnetic field, and an output of the TMR sensor bridge TMR[C] being buffered and AC-coupled to the audio amplifier in the analog signal circuit.

17. The TMR near-field magnetic communication system according to claim 16, comprising a digital signal circuit, the digital signal circuit comprising a comparator, the comparator receiving a DC electrical signal from outputs of the TMR sensor bridge TMR[C] and the TMR sensor bridge TMR[A], an output of the comparator being connected to the digital signal output, and transmitting, through the digital signal output, DC component information of the output signal of the TMR sensor bridge TMR[A] to the audio electroacoustic device.

18. The TMR near-field magnetic communication system according to claim 1, comprising one or more additional TMR sensor bridges TMR[A1], TMR[A2], . . . , TMR[Ai]; all the TMR sensors TMR[Ai] each having a different Hsat; all the TMR sensor bridges TMR[Ai] and the TMR sensor bridge TMR[A] detecting magnetic field components in the same direction; the TMR sensor bridge TMR[Ai] being a high-sensitive linear TMR sensor, a low-sensitive TMR sensor, or a non-linear TMR sensor; and outputs of the TMR sensor bridge TMR[A] and the TMR sensor bridge TMR[Ai] being buffered and AC-coupled to the audio amplifier in the analog signal circuit, the i being a positive integer.

19. The TMR near-field magnetic communication system according to claim 16, wherein a bias field of at least one TMR sensor bridge is greater than a saturation field thereof, and the at least one TMR sensor bridge is enabled to operate within a magnetic field range of 10~100 G, to obtain an optimal signal to noise ratio.

20. The TMR near-field magnetic communication system according to claim 16, wherein the TMR near-field magnetic communication system is packaged into a chip-on-flex package, a multi-chip package, or a chip-on-board package; and the TMR sensor bridge TMR[A] and the TMR sensor bridge TMR[Ai] are manufactured by using a flip die process.

* * * * *